United States Patent [19]

Boitel et al.

[11] Patent Number: 5,131,584

[45] Date of Patent: Jul. 21, 1992

[54] METHOD TO INTERCONNECT ELECTRIC COMPONENTS BY MEANS OF SOLDER ELEMENTS

[75] Inventors: Michelle Boitel, Saint Martin D'Heres; Francois Marion, Saint Egreve; Jean-Louis Pornin, St Hilaire du Touvet; Michel Ravetto, Seyssinet Pariset, all of France

[73] Assignee: Commissariat a l'Energie Atomique, Paris, France

[21] Appl. No.: 508,807

[22] Filed: Apr. 12, 1990

[30] Foreign Application Priority Data

Apr. 26, 1989 [FR] France ................. 89 05542

[51] Int. Cl.$^5$ .............................................. H01L 21/58
[52] U.S. Cl. ................................. 228/180.2; 361/414
[58] Field of Search ................... 361/414, 403, 417; 228/180.2, 254

[56] References Cited

U.S. PATENT DOCUMENTS

| | | | |
|---|---|---|---|
| 3,486,223 | 12/1969 | Butera | 228/254 X |
| 3,869,787 | 3/1975 | Umbaugh | 228/180.2 X |
| 4,166,562 | 9/1979 | Keizer et al. | 228/6.2 X |
| 4,202,007 | 5/1980 | Dougherty | 361/414 X |
| 4,360,142 | 11/1982 | Carpenter | 228/123 |
| 4,760,948 | 8/1988 | Spiecker | 228/180.2 |
| 4,831,724 | 5/1989 | Elliott | 228/180.2 X |

FOREIGN PATENT DOCUMENTS

| | | |
|---|---|---|
| 0002884 | 7/1979 | European Pat. Off. . |
| 0229850 | 7/1987 | European Pat. Off. . |
| 0262580 | 4/1988 | European Pat. Off. . |

Primary Examiner—Kenneth J. Ramsey
Attorney, Agent, or Firm—Pearne, Gordon, McCoy & Granger

[57] ABSTRACT

Method and machine to interconnect electric components by welding elements.

The components (20,24) are provided with electric contact blocks and, given the fact that two components are to be interconnected, the blocks of one of these components are covered with welding elements made of a low melting point metallic material able to be welded to the blocks, the latter being wettable by the material in its molten state, whereas their environment is not so. The components are placed in contact so that these elements cover the corresponding blocks of the other component and the assembly obtained is heated to a temperature enabling the material to be melted.

Application for microelectronics.

5 Claims, 5 Drawing Sheets

METHOD TO INTERCONNECT ELECTRIC COMPONENTS BY MEANS OF SOLDER ELEMENTS

FIELD OF THE INVENTION

The present invention concerns a method to interconnect, by means of soldering elements, electric components, as well as a machine to implement this method. The invention relates more particularly to microelectronic applications.

BACKGROUND OF THE INVENTION

The term "electric components" is understood to include active electric components, such as integrated circuits, and passive electric components, such as ceramic substrates provided with electric contact blocks.

The invention is applicable, for example, to the hybridization of electronic components embodied on silicon substrates, and electronic components embodied on silicon or CdHgTe substrates.

There is already known to exist a first method to interconnect electric components, said method being diagrammatically illustrated on FIG. 1. According to this method, so as to interconnect two components 2 and 4, which respectively comprise a series of electric contact pads 6 and 8, each block of each series is provided with a soldering element 10, the two components are placed opposite each other and are accurately aligned with respect to each other so that each soldering element of one of the components is opposite the soldering element corresponding to the other component. Strong pressure is then exerted on the two components placed in contact so that the soldering elements, made of, for example, indium, yield and provide the electric link between the two components. So as to favor this yielding, it is preferable to soften the soldering elements to a temperature of possibly between 50° C. and 80° C. In addition, it is necessary to apply a force equal to at least 1 gram per pad, this force being applied homogenously on all the blocks so that the two interconnected components are able to bear the thermal and mechanical stresses which appear at the time they are used.

One example of such a method is described in the document (1) FR-A-2 569 052.

This first known method presents a certain number of drawbacks: the solidity of contact between the soldering elements is relatively average, despite the precautions taken as regards temperature and pressure when hybridizing components, this being expressed by the appearance of open contacts when these components are functioning. The number of points able to be hybridized is limited, especially owing to the fact that a force of 15 kilograms is required to hybridize a 128×128 point matrix, a force of 65 kilograms being required to hybridize a 256×256 point matrix. Currently, the applicable limit force using suitable available machines is equal to 15 kilograms. In addition, hybridization efficiency is relatively low with a defect rate of 10%; this efficiency is affected by a non-homogeneous pressure distribution concerning the soldering elements, this non-homogeneity being amplified by a parallelism defect between the components or by the surface unevenness of the latter, especially as regards large components. Finally, the alignment of the components needs to be extremely precise so as to have good hybridization efficiency.

There is also known to exist a second interconnection method described in the document (2), namely the article by J. MARSHALL and al., published in Solid State Technology, January 1979, p. 87 to 93.

According to this second method, the pads of the two components are initially provided with ball-shaped soldering elements for one of the components and with roughly flat-shaped soldering elements for the other component. The component bearing the pads covered with ball-shaped soldering elements is applied against the component to be connected to it, the latter component comprising pads provided with roughly flat soldering elements. This placing in contact of the components is effected so that each solder ball of one of the components is opposite the solder whose corresponding pad is provided on the other component. The assembly thus obtained is then heated to a temperature to melt the solder and is then cooled.

This second known method also has a certain number of drawbacks: it essentially is a complicated method requiring the prior embodiment of solder balls on one of the two components before interconnecting these two components. Furthermore, the solder is present on both components before the latter are interconnected.

The document (3) PCT/GB86/00538, (WO-A-8701509) describes a known third method to interconnect electric components.

This known third method also has a number of drawbacks:

It requires the production of special large pads for self-aligning when hybridizing electronic components, hence a significant active surface loss being limiting for high density connections (matrixes . . . ).

Inherently in this third known method, the distance separating the two components is still smaller than the height of the smallest of the balls enabling these components to be interconnected, hence a limitation as regards withstand strength during thermal cycles (this withstand strength depending on the height of the ball in question).

This third method does not make it possible to make up for any technological defects (non-conforming solder elements, for example).

This third method does not make it possible to compensate any errors due to a bulgy shape of certain components (especially in the case of hybridizing large components, wafer/wafer, for example).

SUMMARY OF THE INVENTION

The object of the present invention is to overcome the drawbacks of the aforesaid known methods by offering a method to interconnect two electric components and which makes it possible to obtain a solid contact between the pads of the two components, to hybridize a large number of points and to improve hybridization efficiency without requiring a high precision of alignment, while being much simpler than the method described in the document (2).

More precisely, the object of the present invention is to offer a method to interconnect a first electric component and at least one second electric component, said components being respectively provided with electric contact pads to be interconnected, this method including one stage in which each pad of the first component is covered with a soldering element or "wafer", which is electrically conductive and which extends over the environment of said pad, these soldering elements or wafers having an approximately constant thickness made of a low melting point metallic material able to be soldered to the pads of the first component, the latter being wettable by this material in the molten state, whereas their environement on the first component is not wettable, this method being characterized in that said material is also weldable to the pads of the second component, these latter pads being wettable by this material in the molten state whereas their environment on the second component is not wettable, and in that the method further includes the following stages:

the first and second components are placed in contact so that the soldering elements or wafers of the first component totally or partly cover the corresponding pads of the second component, the assembly of the first and second components thus obtained is heated to a temperature enabling the metallic material of the soldering elements or wafers to be melted, one of the first and second components being maintained whereas the other is free, and the temperature of the assembly is reduced below the melting temperature of the metallic material.

Preferably, the soldering elements wafers are apporixmately circular.

Where such approximately circular soldering elements or wafers are used, the tolerance of the "alignment" of each pad on the corresponding pad is roughly equal to about one soldering element or wafer radius.

In the present invention, a solder joint is used between each soldering element or wafer and the corresponding pads so that the contacts obtained have excellent solidity. In addition, the present invention does not require any pressure force to be applied to the components and accordingly the number of points to be interconnected may be far less than the number corresponding to the first known method mentioned earlier. In addition, hybridization efficiency is greatly improved than the one obtained with the first known method, especially due to the fact that each soldering element or wafer, when heated to a temperature enabling it to be melted, roughly assumes a spherical shape which is in contact with the pads corresponding to it and which is to be interconnected since these pads are wettable by the solder in the molten state whereas their environment is not wettable. Finally, the method of the present invention requires far less alignment precision than the one required in the first known method mentioned above due to the fact that in the present invention, a self-aligning effect of the components is observed, as shall be more readily understood from reading the rest of this summary.

In addition, the method of the present invention is simpler than the second known method mentioned above due to the fact that it only requires a single soldering element or wafer for each pair of pads to be interconnected and only comprises a single heating stage.

Also, it shall be observed that in the second known method, a deformation of balls occurs owing to them being crushed together, which risks provoking a contact between two balls close to each other. Such a risk does not exist with the soldering elements or wafers of the present invention.

Successive applications of the method of the present invention may make it possible to obtain a stacking of several interconnected components: said first component may consist of a stack or pile of elementary components which have previously been interconnected by repeated applications of the method of the invention, and an additional application of this method makes it possible to obtain a stack comprising a further elementary component.

Successive applications of the method of the invention may also make it possible to interconnect a large component and several other small components: said first component may be this large component already connected to a plurality of other smaller components by repeated applications of the method of the invention, and an additional application of this method makes it possible to increase by one unit the number of other components connected to the large component.

According to one particular mode for implementing the method of the invention, interconnection is effected collectively on an assembly with more than two components at the same time so as to obtain a stacking of these components, each internal component of this stacking being provided with electric contact pads on its two faces, the components of the assembly are stacked, soldering element or wafers made from said material being previously provided on the appropriate pads of the components of the assembly at the rate of one soldering element or wafer for each pair of pads to be interconnected so that the desired electric contacts may be established between the pads of the components of the stacking with this stacking being heated to said temperature, one of the extremity components of the stacking being maintained horizontally, whereas the other components of the stacking are free and are above this extremity component.

According to another particular implementation mode, interconnection is effected collectively on an assembly of more than two components at the same time, one of the components being intended to be interconnected to the others via one of its faces, the assembling of the components is effected, soldering elements or wafers made from said material being previously provided on the appropriate blocks of components of the assembly at the rate of one soldering element or wafer for each pair of pads to be interconnected so that the desired electric contacts may be established between the pads of the components of the assembly with this assembly being heated to said temperature, the component intended to be connected to the other components being maintained horizontally, whereas the other components of the assembly are free and are above said component.

According to one preferred mode for implementing the method of the present invention, after the placing in contact of the components until the latter have cooled below the melting temperature of the metallic material constituting the soldering elements or wafers, one of the components is maintained horizontally, whereas each other component is free and is above the horizontally maintained component.

The metallic material is preferably selected from the group consisting of tin, indium, lead and low melting point metallic alloys containing tin, indium or lead.

The present invention also concerns a machine to interconnect a first electric component and at least one second electric component which are respectively provided with electric contact pads intended to be interconnected, this machine being characterized in that it includes:

procuring means in the first and second components in which the electrically conductive soldering elements or wafers cover the pads of components whilst projecting onto the environment of these blocks, these components provided soldering elements or wafers being selected so that it has one single wafer for each pair of the pads to be interconnected, these wafers being made of a metallic material with a low melting point and able to be soldered to the pads of the components, the latter being wettable by this material in the molten state, whereas their environment concerning the corresponding components is not wettable, means to receive interconnected components, means to align the components and provided to place in contact the soldering elements or wafers of each selected component with the pads of the component to be connected to this selected component, heating means provided to heat the assembly constituting the components placed in contact to a temperature able to melt the material, and means to transfer the components from the procuring means to the receiving means by passing through the alignment means and the heating means.

The alignment means may include:

optical means making it possible to observe the faces of components, namely the faces to be interconnected, and means for the relative displacement of these components.

The heating means may include a through-type oven intended to be traversed by the components placed in contact.

As as variant, these heating means may include a mobile heating table to be applied against the assembly of the components and then moved away from this assembly.

BRIEF DESCRIPTION OF THE DRAWINGS

The present invention shall be more readily understood from a reading of the following description, given purely by way of information and being in no way restrictive, with reference to the accompanying drawings in which.

DETAILED DESCRIPTION OF THE PREFERRED EMBODIMENTS

Figure 1:
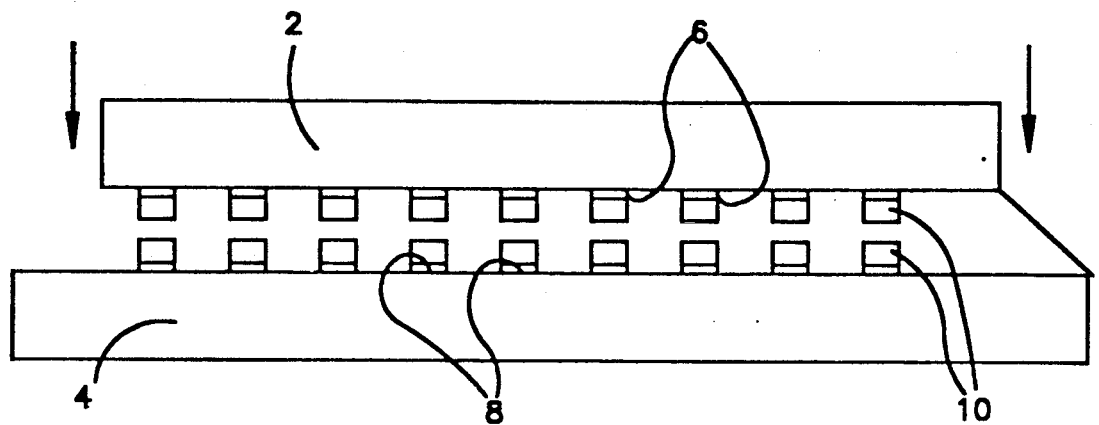
FIG. 1, already described, diagrammatically shows a known method for interconnecting components.
Figure 2:
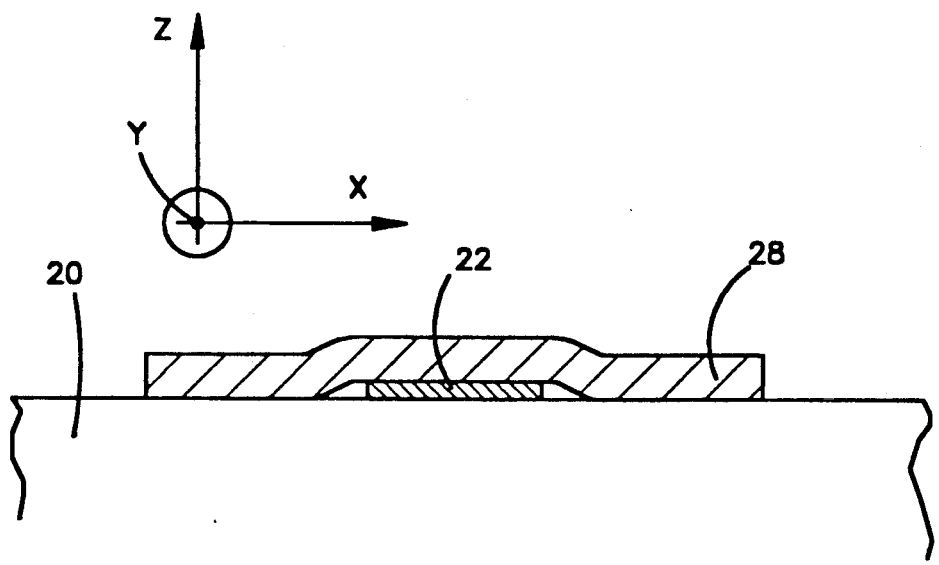
FIG. 2 diagrammatically illustrates a soldering element or wafer covering a pad before the embodiment of the interconnection of two components according to the method of the invention, FIGS. 3A to 3C diagrammatically illustrate various stages for a particular mode for implementing the method of the present invention, FIGS. 4A and 4B diagrammatically illustrate one advantage of the invention, namely that in the latter, the truncation of one or more soldering elements or wafers does not prove to be detrimental, FIGS. 5A to 5C diagrammatically illustrate another advantage of the invention, namely of dispensing with the need for an extremely accurate positioning of the components due to the fact of self-alignment which occurs when they are interconnected in accordance with the invention, FIGS. 6A and 6B again illustrate another advantage of the invention, namely of obtaining an interconnection, even when one of the components is bulged, FIG. 7 diagrammatically illustrates another particular mode for implementing the method of the invention and resulting in obtaining a stack of interconnected components, FIG. 8 diagrammatically illustrates another particular mode implementing the method of the invention and resulting in obtaining interconnections between one large component and several other smaller components.

FIG. 2 diagrammatically illustrates the preparation of a component 20 previously interconnected to another component in accordance with the present invention. As shall be seen more clearly from the following, the component 20, which comprises conductive pads such as 22, is provided with wafers 28 which respectively cover the pads.

Each soldering element or wafer 28 has a roughly constant thickness along the axis z perpendicular to the surface (assumed to be flat) of the component 20 which bears the soldering elements or wafers and the projection of this soldering element or wafer 28, parallel to the axis Z within a plane XY perpendicular to Z, roughly has the shape of a disk.

Figure 3A:
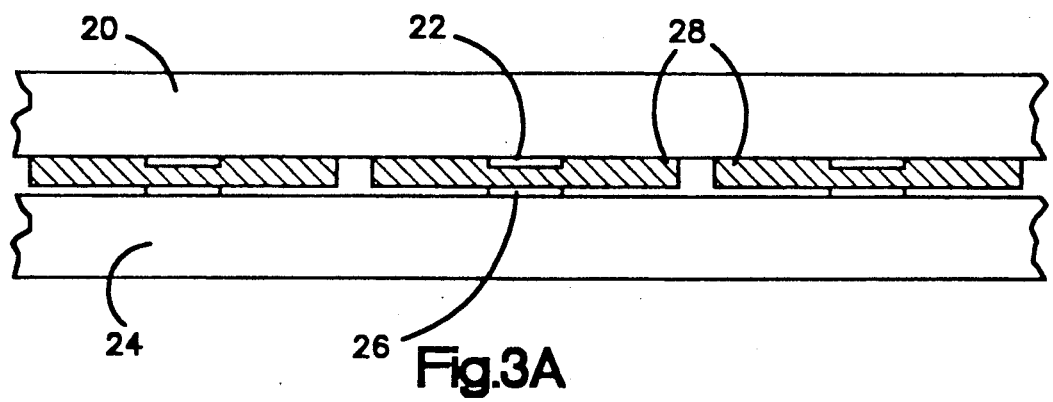
Figure 3B:
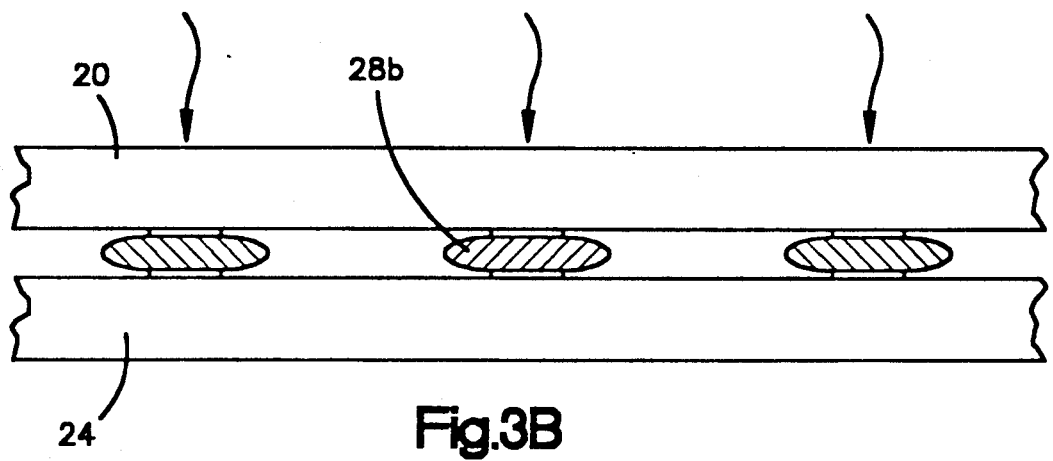
Figure 3C:
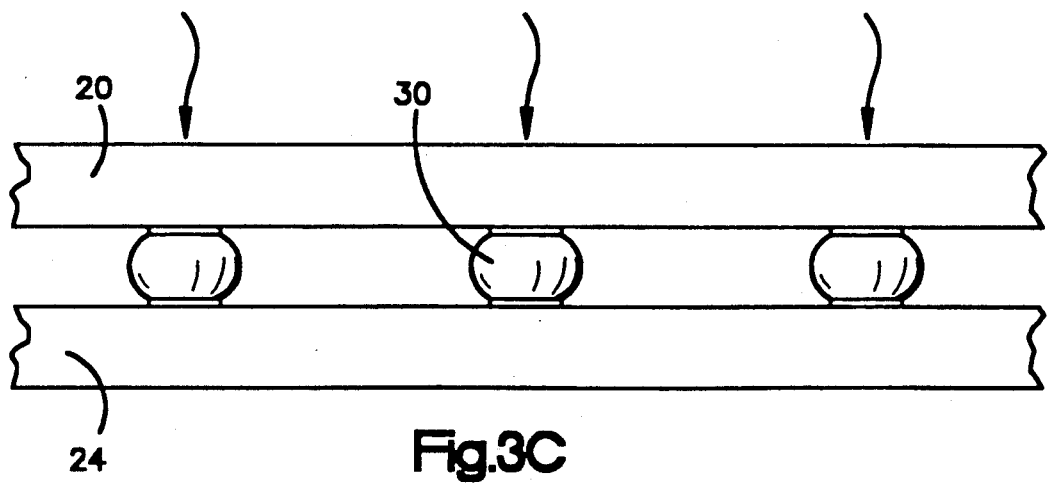

FIGS. 3A to 3C diagrammatically represent the various stages for the particular implementation of the method of the invention. This mode of implementation uses a material, such as indium, which, when liquid, properly wets certain metals, such as gold, but does not wet or only slightly wets certain nonconductors, such as silicon or materials such as polyimides.

Of course, a material is used whose melting point is sufficiently low so as to avoid deteriorating the components when interconnecting the latter in accordance with the present invention. In this respect, indium is entirely suitable.

As can be seen on FIG. 3A, it is assumed that it is desired to interconnect a component 20 provided with pads 22 and a component 24 provided with pads 26 so as to obtain electric links respectively between the pads 22 and 26.

To this effect, one of the two components, such as the component 20, is provided with a plurality of soldering elements or wafers 28 made from said material, such as indium.

Each soldering element or wafer 28 covers a pad 22 and projects from the latter so that it also covers a non-wettable section of the component 20, a section which encompasses the pad 22 in question.

The components 20 and 24 may be complex electronic circuits provided with said pads to allow for their interconnection.

The environment of the pads 22 and 26 is, for example, silicon, non-wettable by said material in its molten state, whereas these pads 22 and 26, which are gold for example, are wettable by this material in its molten state.

Given purely by way of information and being in no way restrictive, said soldering elements or wafers have a diameter of about 60 micrometers and a thickness of about 6 micrometers, the pads being in the form of thin layers 25 micrometers in diameter, have a thickness of about 1 micrometer and are able to be matrix-disposed on the components with a pitch of 70 micrometers, for example. By way of information and being in no way restrictive, this pitch may be as small as 20 micrometers when the diameter of the soldering elements or wafers is equal to or less than 15 micrometers.

The indium soldering elements or wafers 28 are embodied in such a way that they are severed from each other by a known method of the prior art.

The components 20 and 24 are then placed in contact with each other so that each soldering element or wafer 28 covers the block 26 corresponding to it.

This is able to be effected by means of a twin-sight optical system, as shall be seen subsequently.

The interval then separating the components is equal to the thickness of the indium soldering elements or wafers.

The assembly obtained is then heated until it reaches the indium melting temperature.

At this temperature, the two components are repelled owing to the surface tensions of the wafers.

More precisely, this repulsion results from the fact that, when each soldering element or wafer 28 is heated to the indium melting point, the volume of indium assumes a spherical shape and is gathered, localized and clings to the corresponding pads 22 and 26 due to the fact that these pads 24 and 26 are wettable by the indium, whereas the environment of these blocks is not wettable. This results in a certain distance between the two components due to the fact of transforming each soldering element or wafer 28 into a spherical-shaped element (FIG. 3C), after which this soldering element or wafer assumes an expanded form perpendicular to the components and contracted parallel to the latter (FIG. 3B).

The final interval which separates the two interconnected components (FIG. 3C) depends on both the initial indium volume of each soldering element or wafer and the size of the wettable surfaces. In the example above, given purely by way of information and being in no way restrictive, the final interval is about 20 micrometers.

The assembly of the two components is then cooled naturally.

During heating the components and until the latter have cooled, one of the components, such as 24, is maintained (for example, laid on a horizontal support, not shown), whereas the other component 20 is free (for example, above the component 24).

The method described with reference to FIGS. 3A to 3C offers the following advantages:

The embodied interconnection is extremely resistant as a genuine welding of the indium on gold is effected; the tearing apart of the two components moreover shows that the breakage occurs, not at the indium/gold interfaces, but after stretching and rupture of the indium.

The assembly obtained is extremely resistant to aging, thermal cylces and vibrations and satisfies spatial specifications.

Figure 4A:
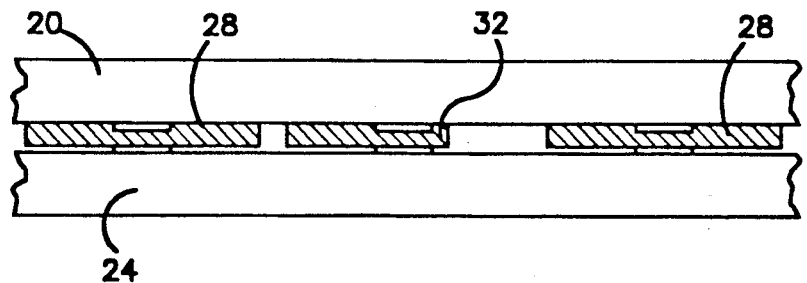
Figure 4B:
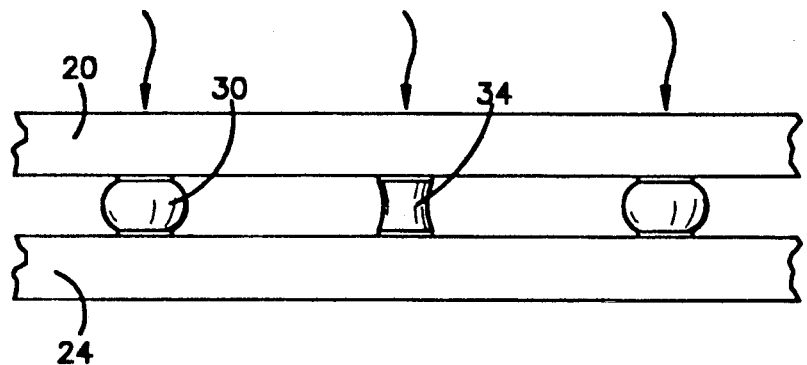

Hybridization efficiency is excellent, the number of rejects being about 0. In the example described with reference to FIGS. 3A to 3C, the pads cannot be in short-circuit since each indium volume "contracts" so as to be solely in contact with the corresponding pads. FIGS. 4A and 4B also diagrammatically illustrate one advantage of the method described with reference with FIGS. 3A and 3B compared with the three known methods mentioned earlier: with the latter, a truncated indium soldering element or wafer shall frequently give an open circuit whereas, with the method described with reference to FIGS. 3A to 3C, an open circuit is never obtained, except when no soldering element or wafer is used, a truncated indium soldering element or wafer 32 (FIG. 4A) finally giving an indium volume 34 (FIG. 4B) smaller than the others since the corresponding indium soldering element or wafer is smaller than the other soldering elements or wafers, but nevertheless allows the corresponding pads to be interconnected.

The indium is only deposited on one of the components to be hybridized.

Figure 5A:
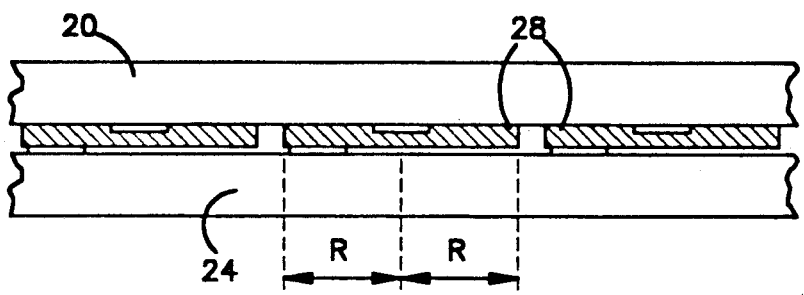

The implementation of the method of the invention provokes a self-aligning phenomenon of the components and thus requires alignment precision much less than is the case with the first known method mentioned earlier: each indium wafer shall simply cover the corresponding wettable surface on the other component (FIG. 5A).

As regards circular soldering elements or wafers with a radius R (FIG. 5A), it can be seen that the tolerance of positioning one block on the corresponding block is about ±R.

Figure 5B:
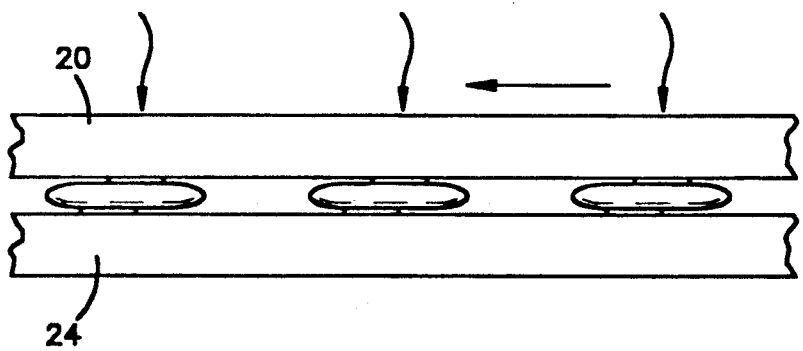
Figure 5C:
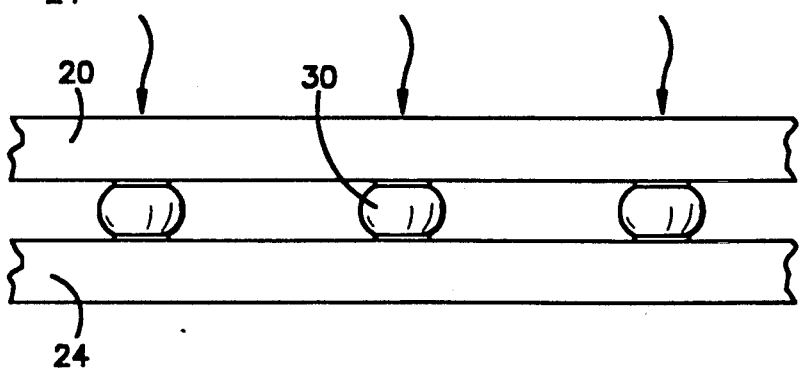

With an imperfect initial alignment, when the indium reaches its melting point, the mechanical effect provoked, firstly by clinging of the indium onto the other component and secondly by the transposing of the indium volume, provokes the self-alignment of the two components, namely a displacement of the component which is free with respect to the component maintained, for example, on a horizontal support (FIG. 5B), so as to arrive at a position of the two components in which the alignment is correct (FIG. 5C).

Figure 6A:
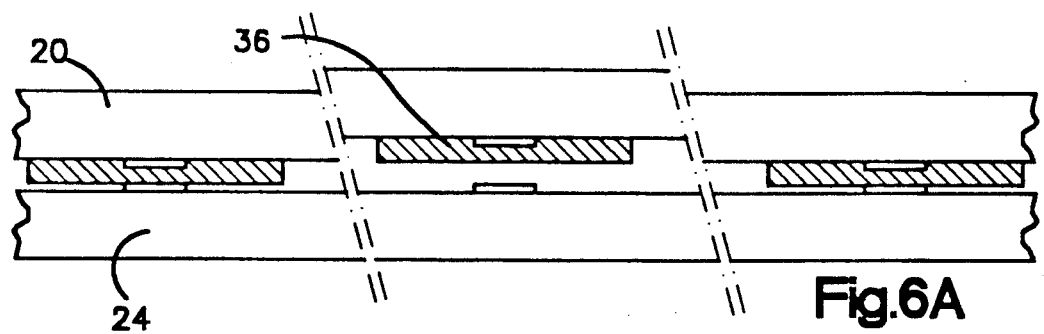
Figure 6B:
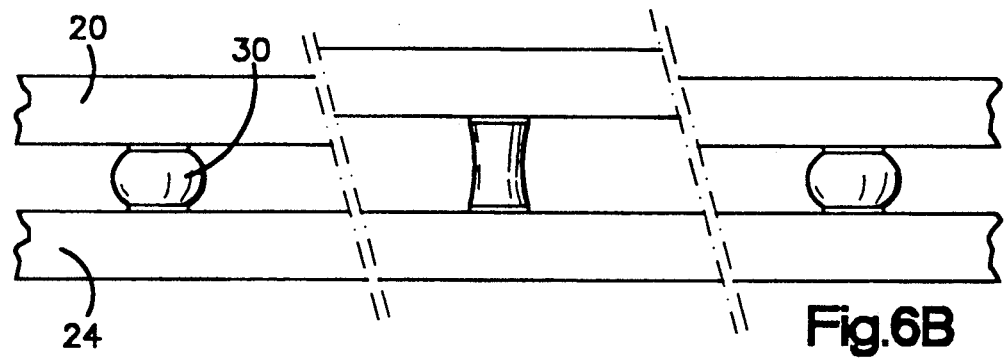

The method of the invention is particularly well-adapted to the hybridization of large surfaces with a high density of points to be interconnected. In fact, via its principle, the invention makes it possible to tolerate the concavity defects currently existing on substrates, such as large silicon wafers, without it being necessary to maintain large pressures required in the afore-mentioned first known method. Owing to this concavity defect, certain indium soldering elements or wafers 36 are not able to be initially in contact with the pads which correspond to them on the other component (FIG. 6A), but after the melting of the indium and the change of the form of the indium volume corresponding to each wafer 36 resulting from this change of form, the electric contact is nevertheless obtained with the corresponding pad on the other component (FIG. 6B).

The surface of each component may range from about 1 square millimeter up to several hundred square centimeters. It will be observed that the invention is more advantageous with an increasing of the surface of the components to be interconnected due to the fact that the concavity mentioned earlier increases with this surface.

The size of the indium soldering elements or wafers may range from several micrometers to about one hundred micrometers.

The distance between two adjacent indium soldering elements or wafers may be about 2 micrometers or more.

The density of these soldering elements or wafers is not limited, provided a pitch of these soldering elements or wafers is selected which is compatible with the size of the latter.

The present invention also makes it possible to embody a structure in which several components 38, 40, 42, 44 are stacked and interconnected (FIG. 7), either by repeating several times the method of the invention so as to connect the component 40 to the component 38 and then the component 42 to the assembly 38-40, and finally the component 44 to the assembly 38-40-42 by the method of the invention, which is particularly advantageous where it is desired to add a component to an already existing structure, either by stacking the components 38, 40, 42 and 44 and by embodying a collective interconnection, which constitutes a simpler technique.

Another structure is able to be embodied according to the invention (FIG. 8) and comprises a large component 46 interconnected to several components 48, 50, 52. Such a structure may be embodied, either by repeating the method of the invention so as to successively interconnect the components 48, 50 and 52 to the component 46, or by embodying a collective interconnection of the components 46, 48, 50 and 52 in accordance with the invention.

Figure 8:
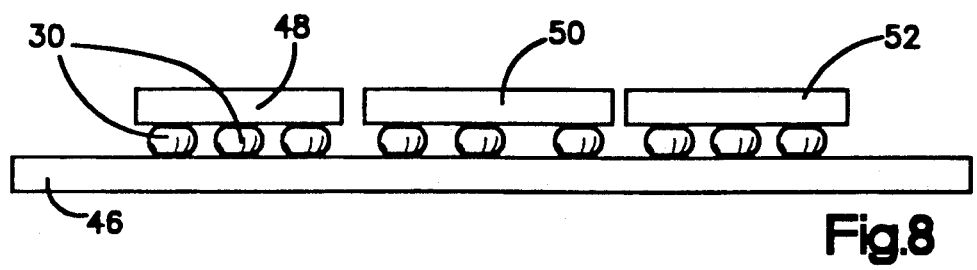

As regards the structure represented on FIG. 8, the advantage of self-alignment procured by the invention shall be observed. It shall also be observed that, for the same structure embodied by the aforesaid first known method (repeated several times), the positioning of a component, such as 48, is independent of the positioning of the other components 50 and 52, which means that the precision of the positioning of the assembly 48-50-52 is the sum of the precisions corresponding to the individual positionings of the component 48, the component 50 and the component 52. On the other hand, as regards the structure represented on FIG. 8 and embodied in accordance with the invention, the positioning of each component 48, 50 or 52 depends on the relative positions of the pads of the component 46 to which these components 48, 50 and 52 need to be connected, hence an interdependence of the positionings of the components 48, 50 and 52 and accordingly an overall precision of positioning which may be better than the precision obtained with the aforesaid first known method.

It shall also be noted that the structure represented on FIG. 8 could not be embodied with this first known method and that, when this structure is embodied in accordance with the invention, it is preferable when there are many components to maintain (horizontally) the component having the most interconnections, the other components being free and disposed in the order desired above this component.

Figure 9:
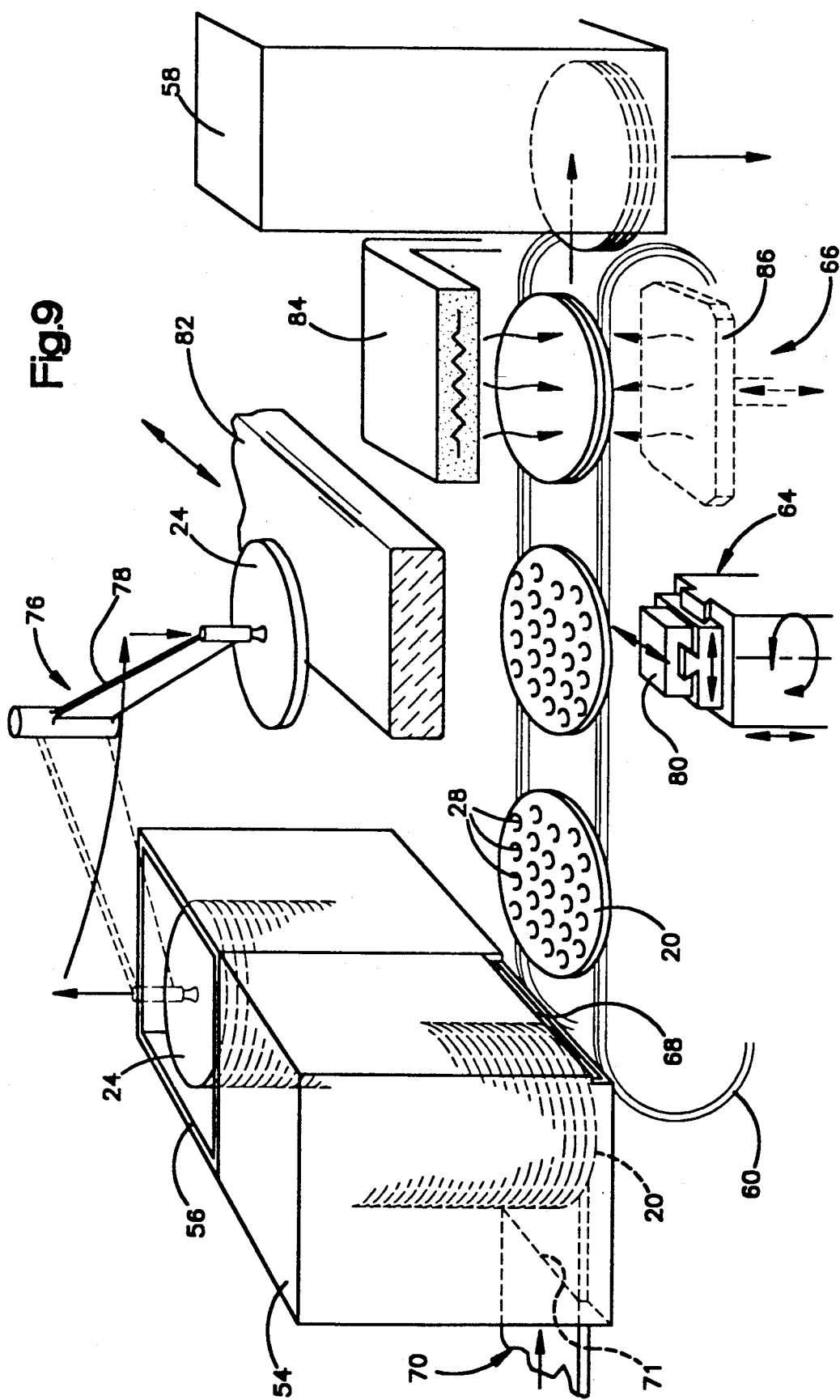
FIG. 9 is a diagrammatic view of a particular embodiment of the machine of the invention.

FIG. 9 diagrammatically shows a particular embodiment of the machine of the invention.

The machine shown on FIG. 9 makes it possible to interconnect two components which may be large substrates, such as two whole wafers of silicon. This machine includes a first container 54 in which the components 20 are stacked vertically, said components 20 previously having been provided with indium soldering elements or wafers 28 so that the face of each component bearing these soldering elements or wafers is turned towards the top of the container 54, and a second container 56 disposed on one side of the container 54 and which contains the vertically stacked components 24 so that the pads of these components, intended to be connected to the indium soldering elements or wafers, are turned towards the bottom of the container 56.

The machine also includes a third container 58 distanced from the containers 54 and 56 and which is intended to receive the assemblies of the components 20 and 24.

The machine shown on FIG. 9 also includes transfer means 60 allowing for the horizontal circulation of the components from the container 54 to the container 58, means 64 allowing for alignment of the components 20 and 24, and means 66 to heat the assembly of these components.

The transfer means 60, known in the prior art, make it possible to transport the component 20 until it is joined to the component 24, and then transport the assembly thus obtained to the container 58 provided to receive this assembly.

At its base and opposite the transfer means, the container 54 comprises an aperture 68 allowing for passage of the components 20 one by one. Means 70 are provided so as to push through this aperture and onto the transfer means the component 20 lowest in the stack. To this effect, the means 70 may include a pushing device provided to previously traverse another aperture 71 opposite said aperture.

During transfer of the component 20 to the means 64, the highest component 24 in the corresponding stack is transferred to an alignment position by means 76 provided to this effect which may include an off-load gripping arm 78. The component 24 suitably positioned for this alignment is kept in the ready or stand-by position via this arm 78.

When the component 20 reaches the means 64, the transfer means 60 are stopped. These means 64 include the support 80 able to move vertically and along two perpendicular and horizontal directions, the support 80 also being able to turn around a vertical axis.

The transfer means 60 diagrammatically appear in the form of two mobile rails suitable for supporting the component 20, these two mobile rails being adapted to allow the support 80 to pass between them.

The means 64 also include a twin-sight system (towards the top and towards the bottom). This system is inserted between the components 20 and 24 so as to effect their alignment and then to retract them once this alignment is obtained.

With the component being stopped at the means 64, the support 80 is moved towards the top until it slightly lifts up the component 20 from the transfer means 60, the optical alignment of the components 20 and 24 being embodied via the system 82 and by means of the appropriate movements of the support 80, after which the system is retracted, the component 24 being lowered until it is in contact with the component 20 by means of a vertical movement lowering the means 76 which then free this component 24 when it is in contact with the component 20. The support 80 is then lowered until the assembly obtained is in contact with the transfer means 60. The alignment is preferably effected to within about 10 micrometers.

The assembly obtained is then transferred to the heating means 66 provided to attain the indium melting temperature.

The heating means 66 may include a through-type halogen lamp oven 84 with a reflector (not shown). This oven is controlled so as to heat the assembly circulating through said oven to the desired temperature in due time, after which the assembly is naturally cooled during its transfer to the container 58.

As a variant, the oven 84 is replaced by a vertically mobile heating table 86 disposed below the transfer means 60. This table 86 possesses extremely large inertia with respect to the assembly obtained so as to avoid disturbing the relative alignment between the two components. The table 86 traverses the transfer means 60 provided for this purpose, as explained concerning the support 80, so that this table 86 is applied against the free face of the assembly obtained during the desired time in order to heat the latter to the desired temperature, after which the table 86 goes down again. As previously, the assembly is then cooled naturally while being transferred to the arrangement container 58.

It shall be observed that procurement by container or case, as well as the station-to-station transfer of wafers of silicon, are means already used on conventional equipment for producing integrated circuits.

The optical alignment to ±10 micrometers is already used in microelectronic applications and in particular on wafer cutting machines. The adaptation to the present invention of such optical alignment systems is able to be embodied by technicians in this field as, as regards the present invention, this alignment does not need to be extremely precise since the self-aligning phenomenon makes it possible to subsequently more accurately define this alignment.

Similarly, the oven and heating table, which make it possible to supply homogeneous energy on a large surface and allow the assembly to attain a temperature defined to ±5° C., are already familiar elements in microelectronic applications.

Of course, the machine described with reference to FIG. 9 makes it possible to embody structures of the type represented on FIG. 8. In order to do this, the component 46 is transported by the transfer means 60 and the components 48, 50 and 52 arranged in one or more cases are successively placed in contact with the component 46 by means of repeated optical alignments. Interconnection thus takes place collectively.

Of course, it is possible to effect successive interconnections by embodying several passages in the machine of FIG. 9.

Figure 7:
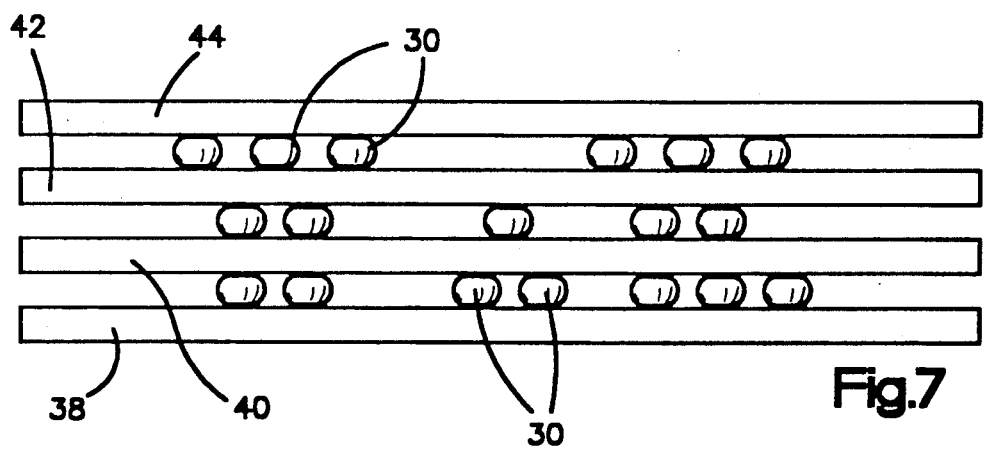

It is also possible to embody a structure of the type represented on FIG. 7 by means of the machine of FIG. 9. To this effect, successive interconnections may be effected via successive passages in the machine so as to progressively constitute the stacking, or to carry out a collective interconnection. To this effect, one of the extremity components of the stacking provided with soldering elements wafers 28 is transferred by the means 60 to an alignment position so as to receive the adjacent component of the stack. The stacking obtained may identically receive a third component and so on, until the complete stacking is obtained, this stacking then being transferred to the heating means where the actual interconnection takes place, after which the stacking is arranged in a case.

What is claimed is:

1. A method to interconnect a first electric component and at least a second electric component which are respectively provided with electric contact pads intended to be interconnected, said pads being matrix-arranged on the components with a pitch equal to or less than about 70 micrometers, this method including a stage in which one or more soldering elements of a low melting point, electrically conductive material, which elements are substantially disk-shaped, of approximately constant thickness and solderable to the pads of the first component, cover each pad of the first component, these pads being wettable by this material when in its molten state, such that the soldering element extends over the environment of the pad, said environment not being wettable by the material, said material is also solderable to the pads of the second component, which pads are wettable by this material when in its molten state, whereas their environment is not wettable, and the method further includes the following stages:

the first and second components are placed in contact so that the soldering elements of the first component totally or partly cover the corresponding pads of the second component, the assembly thus obtained of the first and second components is heated to a temperature able to melt the metallic material of the soldering elements one of the first and second components being maintained, whereas the other is free to move relative to the other as the melted disk-shaped elements form into generally spherical elements, and the temperature of the assembly is reduced below the melting temperature of the metallic material wherein said metallic material solidifies.

2. A method according to claim 1, wherein the interconnection is effected on an assembly of more than two components collectively at the same time so as to obtain a stack of these components, each internal component of the stack having electric contact pads on its two faces and one soldering element made of said material being previously provided for each pair of pads to be interconnected so that the desired electric contacts may be established between the pads of the components of the stack, said stack being heated to said temperature, while one of the extremity components of the stack is maintained horizontally and the other components of the stack are free and are above this extremity component.

3. A method according to claim 1, wherein the interconnection is effected on an assembly of more than two components collectively at the same time one of the components being intended to be interconnected to the other via one of its faces, wherein the assembly of the components utilizes soldering elements made of said material having been previously provided on the appropriate component pads of the assembly at the rate of one soldering element for each pair of pads to be interconnected so that the desired electric contacts are able to be established between the pads of the components of the assembly, and wherein this assembly is heated to said temperature, the component intended to be connected to the other components being maintained horizontally, whereas the other components of the assembly are free and are above said component.

4. A method according to claim 1, wherein after the placing in contact of the components until they have been cooled below the melting temperature of the metallic material constituting the soldering elements of wafers, one of the components is maintained horizontally, whereas each other component is free and is above the component maintained horizontally.

5. A method according to claim 1, wherein the metallic material is selected from the group consisting of tin, indium, lead and low melting point metallic alloys containing tin, indium or lead.

* * * * *

UNITED STATES PATENT AND TRADEMARK OFFICE
CERTIFICATE OF CORRECTION

PATENT NO. : 5,131,584

DATED : July 21, 1992

INVENTOR(S) : Michelle Boitel, Francois Marion, Jean-Louis Pornin and Michel Ravetto It is certified that error appears in the above-identified patent and that said Letters Patent is hereby corrected as shown below:

Column 1, line 28, delete "block" and insert --pad--; and line 42, delete "homogenously" and insert --homogeneously--.

Column 2, line 50, delete "wafer/wafer" and insert --Wafer to Wafer--.

Column 3, line 9, delete "weldable" and insert --solderable--; and lines 26 and 27, delete "apporixmately" and insert --approximately--.

Column 8, line 65, delete "latter" and insert --elements--.

Column 11, line 45, after "elements" insert --or--.

Column 12, Claim 4, lines 4 and 5, delete "of wafers".

Signed and Sealed this

Ninth Day of November, 1993

Attest:

BRUCE LEHMAN

*Attesting Officer*      *Commissioner of Patents and Trademarks*